(12) United States Patent
Jeon et al.

(10) Patent No.: US 11,264,700 B2
(45) Date of Patent: Mar. 1, 2022

(54) ELECTRONIC DEVICE WITH ANTENNA

(71) Applicant: Samsung Electronics Co., Ltd., Gyeonggi-do (KR)

(72) Inventors: Seunggil Jeon, Gyeonggi-do (KR); Jongsam Park, Gyeonggi-do (KR); Seongbeom Hong, Gyeonggi-do (KR); Sunghoon Moon, Gyeonggi-do (KR); Kyungwoo Lee, Gyeonggi-do (KR); Wonjoon Choi, Gyeonggi-do (KR)

(73) Assignee: Samsung Electronics Co., Ltd

( * ) Notice: Subject to any disclaimer, the term of this patent is extended or adjusted under 35 U.S.C. 154(b) by 60 days.

(21) Appl. No.: 16/723,405

(22) Filed: Dec. 20, 2019

(65) Prior Publication Data

US 2020/0203802 A1 Jun. 25, 2020

(30) Foreign Application Priority Data

Dec. 20, 2018 (KR) .................. 10-2018-0166614

(51) Int. Cl.
*H01Q 1/22* (2006.01)
*H01Q 1/24* (2006.01)
(Continued)

(52) U.S. Cl.
CPC ............ *H01Q 1/2283* (2013.01); *H01Q 1/22* (2013.01); *H01Q 1/24* (2013.01); *H01Q 9/40* (2013.01);
(Continued)

(58) Field of Classification Search
CPC .......... H01Q 1/2283; H01Q 1/24; H01Q 9/40; H01Q 21/065; H01Q 19/06; H01Q 15/08;
(Continued)

(56) References Cited

U.S. PATENT DOCUMENTS 7,382,331 B2  6/2008  Kurashima et al.
7,804,453 B2*  9/2010  Chiang ................ H01Q 1/2266
                                                            343/702

(Continued)

FOREIGN PATENT DOCUMENTS

DE      102016120665      4/2018

OTHER PUBLICATIONS

International Search Report dated Apr. 13, 2020 issued in counterpart application No. PCT/KR2019/018136, 7 pages.
(Continued)

*Primary Examiner* — Hai V Tran
(74) *Attorney, Agent, or Firm* — The Farrell Law Firm, P.C.

(57) ABSTRACT

An electronic device is provided that includes a housing; a printed circuit board including a first and second surfaces; an antenna module disposed on the first surface and adjacent to a side surface member, forming a first gap therewith, the antenna module being configured to radiate an antenna beam; a wireless communication circuit electrically connected with the antenna module, and configured to transmit or receive a signal having a frequency between 3 and 100 gigahertz; and a dielectric structure including a seating portion to have the antenna module mounted thereon, and configured to form the antenna beam to be radiated toward an outside of the housing.

20 Claims, 11 Drawing Sheets

(51) Int. Cl.
  *H01Q 9/40* (2006.01)
  *H04B 1/40* (2015.01)
  *H01Q 21/06* (2006.01)
  *H04M 1/02* (2006.01)
  *H05K 1/18* (2006.01)

(52) U.S. Cl.
  CPC ............ *H01Q 21/065* (2013.01); *H04B 1/40* (2013.01); *H04M 1/0277* (2013.01); *H05K 1/182* (2013.01); *H05K 2201/10007* (2013.01)

(58) Field of Classification Search
  CPC . H01Q 1/243; H01Q 1/22; H04B 1/40; H05K 1/182; H05K 2201/10007; H04M 1/0277
  USPC ..................................................... 343/700 R
  See application file for complete search history.

(56) References Cited

U.S. PATENT DOCUMENTS

| | | | | |
|---|---|---|---|---|
| 2009/0296527 | A1* | 12/2009 | Cuschieri | G01V 1/201 367/134 |
| 2012/0249388 | A1* | 10/2012 | Hansen | H01Q 1/243 343/753 |
| 2014/0203969 | A1* | 7/2014 | Maltsev | H01Q 3/00 342/375 |
| 2016/0018856 | A1* | 1/2016 | Heo | H01Q 1/48 361/679.55 |
| 2016/0233573 | A1 | 8/2016 | Son et al. | |
| 2017/0214132 | A1* | 7/2017 | Jeon | H01Q 1/38 |
| 2018/0083343 | A1 | 3/2018 | Choon et al. | |
| 2018/0212307 | A1 | 7/2018 | Kim et al. | |
| 2018/0241115 | A1* | 8/2018 | Cho | H04M 1/0266 |
| 2018/0309185 | A1 | 10/2018 | Akiyama et al. | |
| 2019/0165473 | A1* | 5/2019 | Yun | H01Q 21/28 |
| 2019/0273305 | A1* | 9/2019 | Yun | H01Q 13/10 |

OTHER PUBLICATIONS

European Search Report dated May 18, 2020 issued in counterpart application No. 19218034.7-1205, 13 pages.
European Search Report dated Sep. 3, 2020 issued in counterpart application No. 19218034.7-1205, 11 pages.

* cited by examiner

ELECTRONIC DEVICE WITH ANTENNA

CROSS-REFERENCE TO RELATED APPLICATION(S)

This application is based on and claims priority under 35 U.S.C. § 119 to Korean Patent Application No. 10-2018-0166614, filed on Dec. 20, 2018, in the Korean Intellectual Property Office, the disclosure of which is incorporated by reference herein in its entirety.

BACKGROUND

1. Field

The present disclosure relates generally to an electronic device with an antenna.

2. Description of Related Art

A traditional electronic device is configured to have an antenna separated from a communication main body, or to have an antenna protruding to the outside of a housing. For example, the antenna may be an external antenna of the electronic device.

In recent years, embedded antenna methods have been introduced, and an antenna can be disposed inside a housing of an electronic device. In such an electronic device, the embedded antenna may be disposed as far as possible away from the center of the electronic device, in the inner space of the housing, with a circuit and a physical instrument (for example, a carrier, a holder, or a bracket).

However, propagation of communication radio signals may be interrupted by the housing of the electronic device, and there is a limit to a space of the housing in which a 5G radiation antenna module is mounted. Therefore, an array mounting size of a millimeter (mmWave) module is limited (for example, 1×4, 2×2), and thus effective isotropically radiated power (EIRP) may be increased.

An mmWave radiation coverage of the electronic device may be determined depending on the overall influence of the shape or structure of the housing, a mounting structure of the mmWave module, and an internal ground or a peripheral metal structure. In this case, a radiation pattern within the coverage region may indicate that a beamform radiated from the mmWave module in a free state is not uniform.

In particular, when a plurality of mmWave modules are mounted in the electronic device, ambient radiation environments of the plurality of mmWave modules are different. Therefore, beam distortion may appear differently. For example, since one antenna module may be positioned in the proximity of peripheral metal structures, and another antenna module may be positioned at a long distance from the peripheral metal structures, the respective antenna modules may have different ambient environments.

Thus, it may be advantageous to provide an electronic device which can adjust antenna beamforming radiated from an antenna module.

SUMMARY

The present disclosure has been made to address the above-mentioned problems and disadvantages, and to provide at least the advantages described below.

In accordance with an aspect of the present disclosure, an electronic device is provided that includes a housing including a first plate facing in a first direction, a second plate facing in a second direction opposite to the first direction, and a side surface member surrounding at least part of a space between the first and second plates; a printed circuit board including a first surface facing in the first direction and a second surface facing in the second direction, the printed circuit board being disposed in the housing; an antenna module disposed on the first surface of the printed circuit board and adjacent to the side surface member, forming a first gap therewith, the antenna module being configured to radiate an antenna beam in a third direction which is perpendicular to the first and second directions; a wireless communication circuit electrically connected with the antenna module, and configured to transmit or receive a signal having a frequency between 3 gigahertz (GHz) and 100 GHz; and a dielectric structure including a seating portion to have the antenna module mounted thereon, and configured to form the antenna beam to be radiated toward an outside of the housing in the third direction.

In accordance with another aspect of the present disclosure, an electronic device is provided that includes a housing including a first plate facing in a first direction, a second plate facing in a second direction opposite to the first direction, and a side surface member surrounding at least part of a space between the first and second plates; a printed circuit board including a first surface facing in the first direction and a second surface facing in the second direction, the printed circuit board being disposed in the housing; an antenna module disposed on the first surface of the printed circuit board and adjacent to the side surface member, forming a first gap therewith, the antenna module being configured to radiate an antenna beam in a third direction which is perpendicular to the first and second directions; a wireless communication circuit electrically connected with the antenna module, and configured to transmit or receive a signal having a frequency between 3 GHz and 100 GHz; an injection support member including a seating portion to have the antenna module mounted thereon, and configured to form an antenna beam to be radiated toward an outside of the housing in the third direction; a first peripheral metal structure configured to connect a seated subscriber identity module (SIM) card to the printed circuit board; and a second peripheral metal structure disposed in parallel with and between the first peripheral metal structure and the second plate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
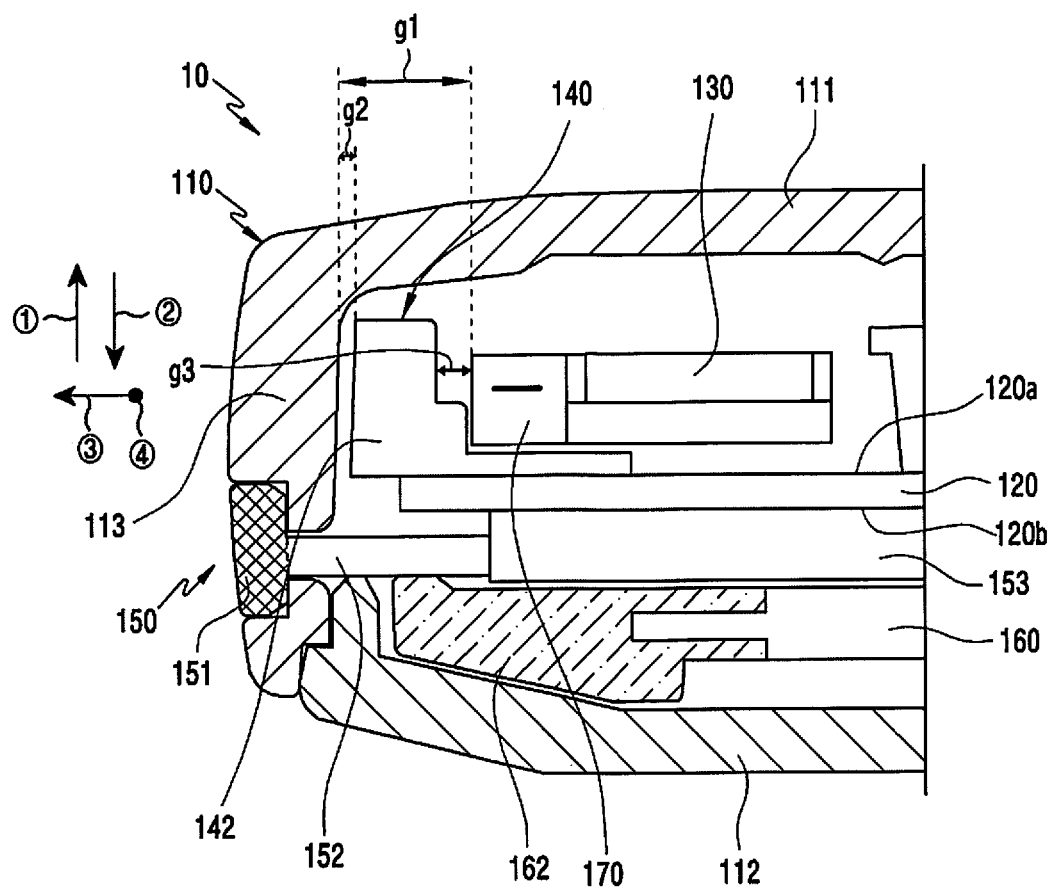
FIG. 1 is a cross-sectional view illustrating an antenna module mounting structure of an electronic device, according to an embodiment.

Various embodiments of the present disclosure are described with reference to the accompanying drawings. However, various embodiments of the present disclosure are not limited to particular embodiments, and it should be understood that modifications, equivalents, and/or alternatives of the embodiments described herein can be variously made. With regard to description of drawings, similar components may be marked by similar reference numerals.

An electronic device may include at least one of, for example, smartphones, tablet personal computers (PCs), mobile phones, video telephones, electronic book readers, desktop PCs, laptop PCs, netbook computers, workstations, servers, personal digital assistant (PDAs), portable multimedia players (PMPs), Motion Picture Experts Group (MPEG-1 or MPEG-2) audio layer 3 (MP3) players, mobile medical devices, cameras, or wearable devices (for example, smart glasses, head-mounted-devices (HMDs), electronic apparel, electronic bracelets, electronic necklaces, electronic appcessories, electronic tattoos, smart mirrors, or smart watches).

FIG. 1 is a cross-sectional view illustrating an antenna module mounting structure of an electronic device, according to an embodiment.

Referring to FIG. 1, the electronic device 10 includes a housing 110, a printed circuit board 120, an antenna module 130, a dielectric structure 140, a first peripheral metal structure 153, and a second peripheral metal structure 160.

The electronic device 10 may include the housing 110 which serves as an exterior and protects a plurality of electronic components. The housing 110 may include a first plate 111, a second plate 112, and a side surface member 113. The first plate 111 may be disposed to face in a first direction (①) and the second plate 112 may be disposed to face in a second direction (②) opposite to the first direction (①), and the side surface member 113 may be disposed to face in a third direction (③) which is perpendicular to the first and second directions (①, ②).

The printed circuit board 120 may be disposed between the first and second plates 111 and 112 and may include a first surface 120a facing in the first direction (①) and a second surface 120b facing in the second direction (②). The printed circuit board 120 may have a plurality of electronic components disposed therein, and may have a plurality of transmission circuits formed therein.

The electronic device 10 may have the antenna module 130 and the dielectric structure 140 disposed in the first direction (①) with reference to the printed circuit board 120, and may have the first peripheral metal structure 153 and/or the second peripheral metal structure 160 disposed in the second direction (②).

The first peripheral metal structure 153 may be a metallic body to connect a seated SIM card to the printed circuit board 120. The second peripheral metal structure 160 may be disposed between and in parallel with the first peripheral metal structure 153 and the second plate 112. The first peripheral metal structure 153 may include a SIM card socket, and the second peripheral metal structure 160 may include an internal support structure (for example, a support member) having at least a portion formed with a metallic material and supporting the printed circuit board 120. Hereinafter, the first peripheral metal structure 153 is referred to as a SIM card socket, and the second peripheral metal structure 160 is referred to as an internal support structure.

A SIM card socket device 150 may include a SIM card cover 151, a SIM card tray 152, and the SIM card socket 153. The SIM card cover 151 may be disposed in an opening formed on the side surface member 113 to face in the third direction (③). The SIM card tray 152 may be connected to the SIM card cover 151, and may have a SIM card seated therein and may be inserted into and drawn out (i.e., removed from) in the third direction (③). The SIM card socket 153 may electrically connect the seated SIM card to the printed circuit board 120. At least a portion of the SIM card socket 153 may include a metallic material.

The internal support structure is a support member which supports the printed circuit board 120, and may be disposed between the SIM card socket 153 and the second plate 112. The internal support structure may have at least a portion formed with a metallic material.

The internal support structure may have an internal cover 162 connected thereto. The internal cover 162 may be disposed between and in parallel with the second plate 112 and the SIM card socket 153. The printed circuit board 120, the SIM card socket device 150, the internal support structure, and the second plate 112 may be vertically stacked on top of one another.

The antenna module 130 may be disposed on the first surface 120a of the printed circuit board 120. For example, the antenna module 130 may include at least one antenna array 170 supporting communication of an mmWave frequency band. The antenna module 130 may be disposed on the first surface 120a of the printed circuit board 120 by the dielectric structure 140. The antenna module 130 may be disposed adjacent to the side surface member 113, and may be disposed to have a first gap g1 with an inner surface of the side surface member 113. The antenna module 130 disposed in the above-described structure may be disposed to radiate an antenna beam in the third direction facing in the direction perpendicular to the first and second directions (①, ②). The third direction (③) may be a direction that faces toward the outside of the housing 110 from the antenna module 130 through the side surface member 113.

The dielectric structure 140 may be disposed in front of the antenna module 130, such that an antenna beam radiated from the antenna module 130 can have a radiation pattern enhanced by the dielectric structure 140. The dielectric structure 140 adjacent to the front surface of the antenna array 170 may have a third gap g3 with the antenna module 130 to reduce a change in the resonant frequency of the antenna array 170 caused by the dielectric structure 140.

The antenna module 130 may be electrically connected with a wireless communication circuit (module). For example, the antenna module 130 may be configured to transmit and/or receive a signal having a frequency between 3 GHz and 100 GHz.

The dielectric structure 140 may have a seating portion to have the antenna module 130 seated thereon, and may be disposed between the side surface member 113 and the antenna module 130 to form an antenna beam radiated from the antenna module 130. The dielectric structure 140 may be disposed adjacent to the side surface member 113, and may have a second gap g2 with an inner surface of the side surface member 113. At least part of the surface of the dielectric structure 140 may be disposed to face the inner surface of the side surface member 113. The second gap g2 may be smaller than the first gap g1.

The dielectric structure 140 may include a support member of an injection molding material. Hereinafter, the dielectric structure 140 is referred to as a support member of an injection molding material.

Figure 2:
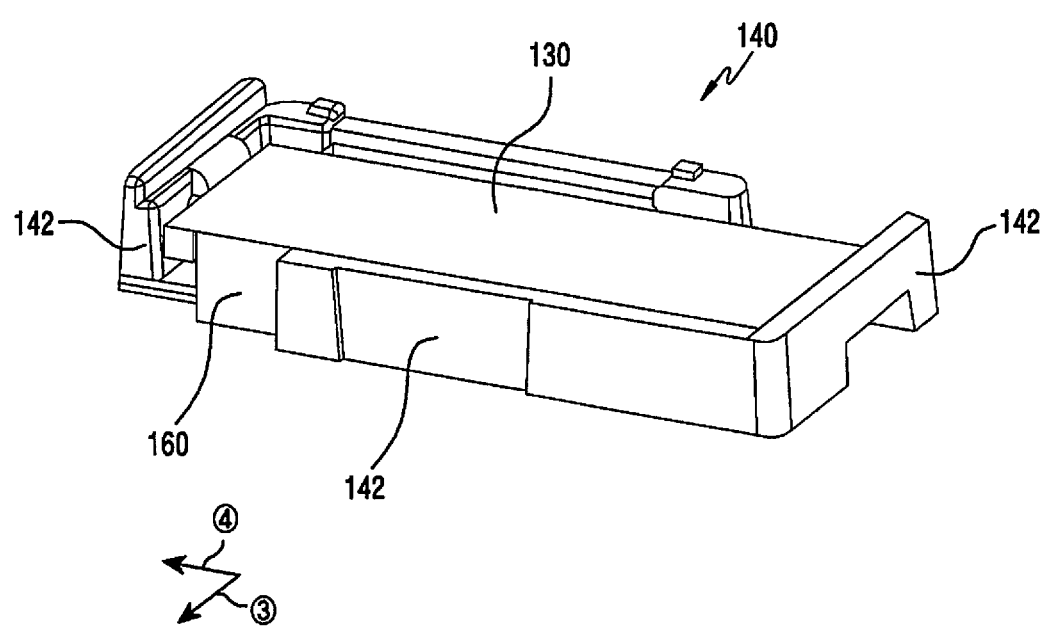
FIG. 2 is a perspective view illustrating a state in which an antenna module is mounted in a dielectric structure mounted in an electronic device, according to an embodiment.
Figure 3:
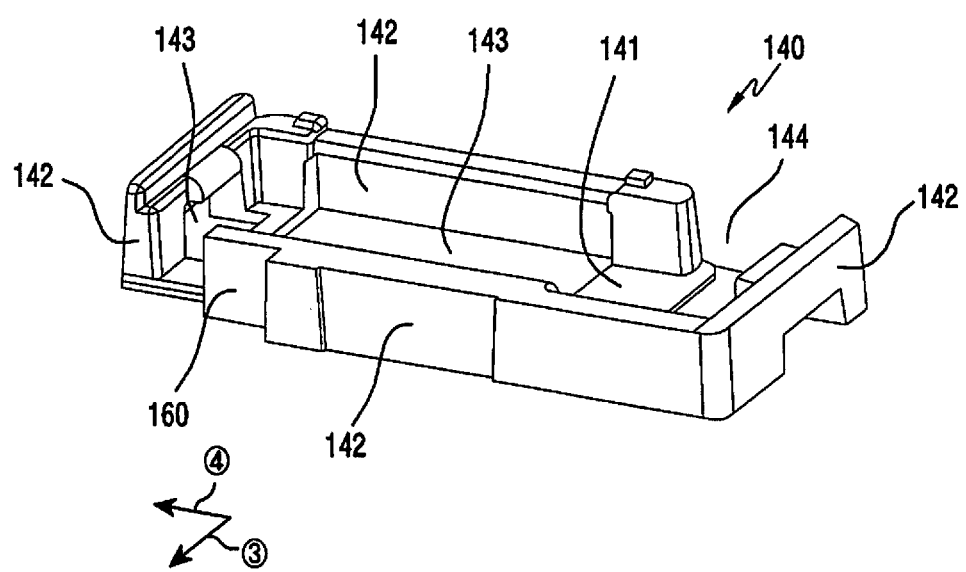
FIG. 3 is a perspective view illustrating a dielectric structure, according to an embodiment.

FIG. 2 is a perspective view illustrating a state in which an antenna module is mounted in a dielectric structure, according to an embodiment. FIG. 3 is a perspective view illustrating another dielectric structure, according to an embodiment.

Referring to FIGS. 2 and 3, the support member 140 is fixed onto a printed circuit board 120 by a locking structure. The support member 140 includes a base 141 and a vertical sidewall 142. The base 141 is a bottom portion of the support member 140, and may be disposed in contact with a portion of a first surface of the printed circuit board (for example, the first surface 120a shown in FIG. 1). The vertical sidewall 142 extends along a circumference of the base 141, while protruding in a vertically upward direction.

The vertical sidewall 142 may be disposed on a front surface of an antenna array 170 to enhance a radiation pattern. The vertical sidewall 142 adjacent to the front surface of the antenna array 170 may have a third gap g3 formed with the antenna module 130 to reduce a change in the resonant frequency of the antenna array 170 caused by the vertical sidewall 142.

An inner space of the support member 140 surrounded by the vertical sidewall 142 may be a seating portion to which the antenna module 130 is fixed. The antenna module 130 may be fixed in parallel with the support member 140.

The vertically upward direction may be the first direction (①). The base 141 may include at least one first opening 143, and the vertical sidewall 142 may include at least one second opening 144. The second opening 144 may be a hole through which a portion of a soft circuit board, which electrically connects the antenna module to the printed circuit board 120, passes through.

The support member 140 may further include a protrusion 160 formed thereon to prevent the seated antenna module 130 from being released. The protrusion 160 may protrude from one vertical sidewall 142 in a fourth direction (④). The fourth direction (④) may be perpendicular to the first (①), second (②), and third directions (③).

The vertical sidewall 142 may be disposed on the front surface of the antenna array 170 to enhance a radiation pattern. The vertical sidewall 142 adjacent to the front surface of the antenna array 170 may have the third gap g3 formed with the antenna module 130 to reduce a change in the resonant frequency of the antenna array 170 caused by the vertical sidewall 142.

Figure 4:
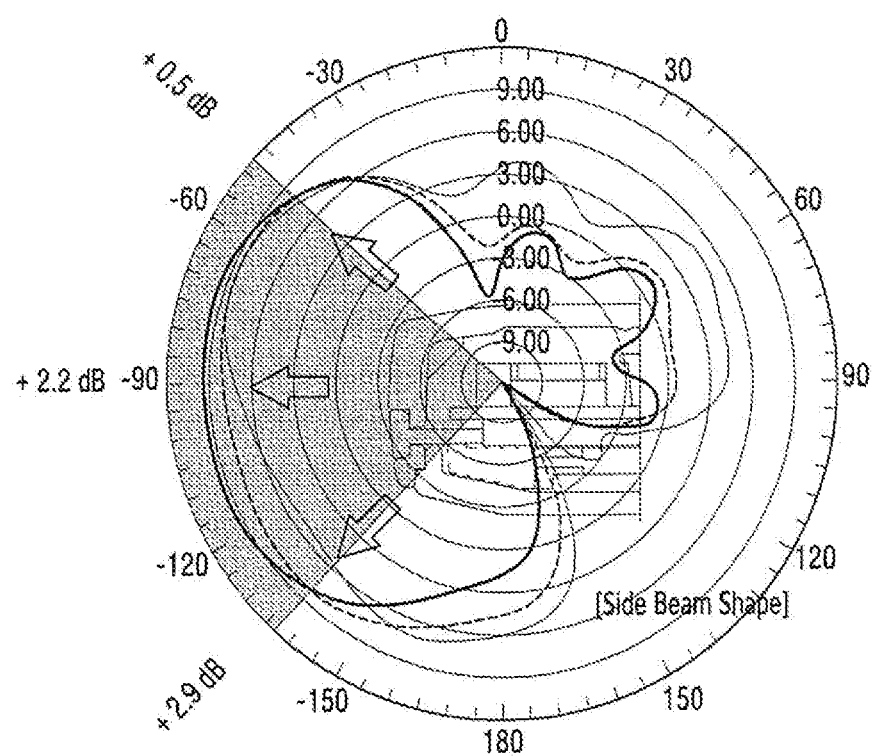
FIG. 4 is a view illustrating a graph indicating a radiation distribution of an antenna module of an electronic device, according to an embodiment.

FIG. 4 is a view illustrating a graph indicating a radiation distribution of an antenna module, according to an embodiment.

Referring to FIG. 4, a radiation pattern colored gray indicates a radiation pattern when there is no vertical sidewall on the front surface of the antenna array 170. It can be seen that unnecessary radiation on a lower side or rear surface is greater than radiation on a side surface which is a main radiation direction. Such a radiation pattern may be distorted by a dielectric included in the housing 110 and the internal cover 162 because a propagation speed of a signal changes according to each direction due to the dielectric included in the housing 110 and the internal cover 162. A radiation pattern colored black indicates a radiation pattern after distortion of the radiation pattern caused by the dielectric included in the housing 110, and the internal cover 162 is compensated for by the vertical sidewall 142 disposed on the front surface of the antenna array as shown in FIG. 3. It can be seen that a gain is enhanced to 0.5 decibels (dB) to 2.9 dB in the main radiation direction. Symmetric beamforming is guaranteed and a front to back (FB) ratio is enhanced.

Figure 5:
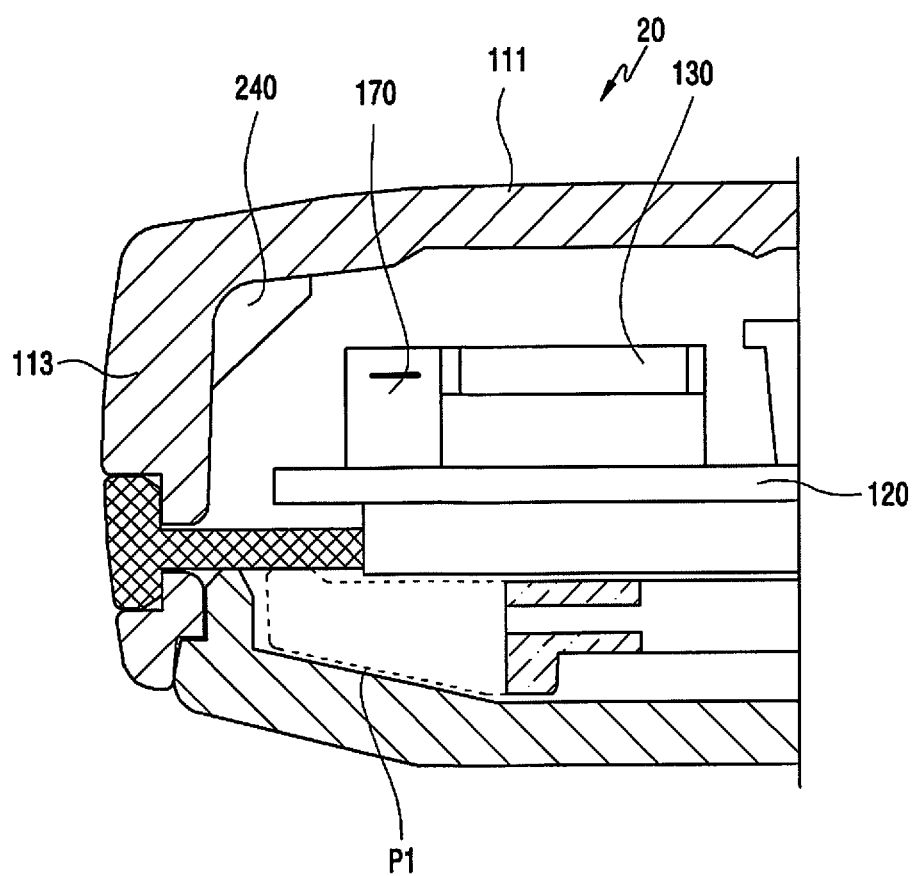
FIG. 5 is a cross-sectional view illustrating an antenna module mounting structure of an electronic device, according to an embodiment.

FIG. 5 is a cross-sectional view illustrating an antenna module mounting structure of an electronic device, according to an embodiment.

Referring to FIG. 5, regarding the electronic device 20, the same elements as in the electronic device 10 will not be described and only different elements will be described. The electronic device 20 may differ from the electronic device 10 in a dielectric structure 240.

The electronic device 20 includes the dielectric structure 240 formed in front of the antenna module 130 disposed on the printed circuit board 120. The dielectric structure 240 may be formed on a portion facing the front portion of the antenna module 130 as an injection molding structure. The dielectric structure 240 may be formed on a corner region between the first plate 111 and the side surface member 113. The dielectric structure 240 may differ a surface facing the antenna module 130 as an inclined surface.

In the electronic device 20, nonmetallic portions may be substantially re-distributed, that is, some nonmetallic structures P1 positioned under the printed circuit board 120 may be deleted and the dielectric structure 240 which is a nonmetallic structure positioned in front of the antenna module over the printed circuit board 120 may be added, such that a gain of the antenna module 130 can be generated. A distribution of dielectrics in a main radiation direction of the antenna array 170 is uniform or similar, such that radiation pattern distortion caused by a housing 110 can be mitigated.

Figure 6A:
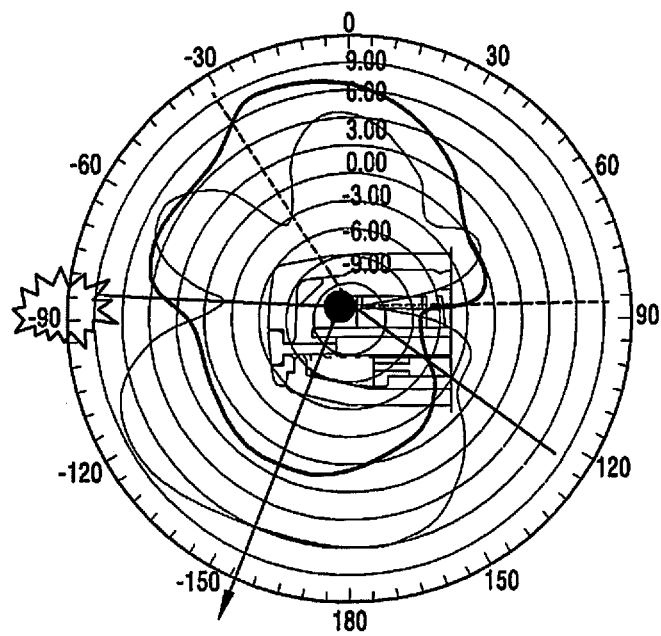
FIGS. 6A and 6B are views illustrating graphs indicating radiation distributions of an antenna module according to whether there is a dielectric structure, according to an embodiment.
Figure 6B:
Figure 6B:
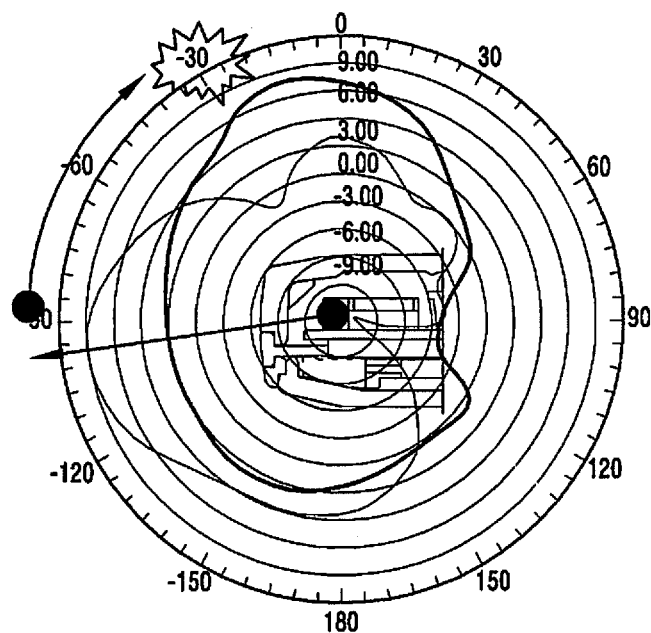

FIGS. 6A and 6B are views illustrating graphs indicating radiation distributions of an antenna module according to whether there is a dielectric structure, according to an embodiment. A pattern colored black indicates a phase of a signal and a pattern colored gray indicates a radiation pattern.

Referring to FIGS. 6A and 6B, when there is a dielectric structure (for example, the dielectric structure 240 shown in FIG. 5) in FIG. 6B, null of a side surface disappears from a radiation pattern due to the dielectric structure, a phase distribution of a main beam is changed in the radiation distribution, and a phase change in the direction of 90 degrees is mitigated, in comparison to FIG. 6A in which there is no dielectric structure.

Figure 7:
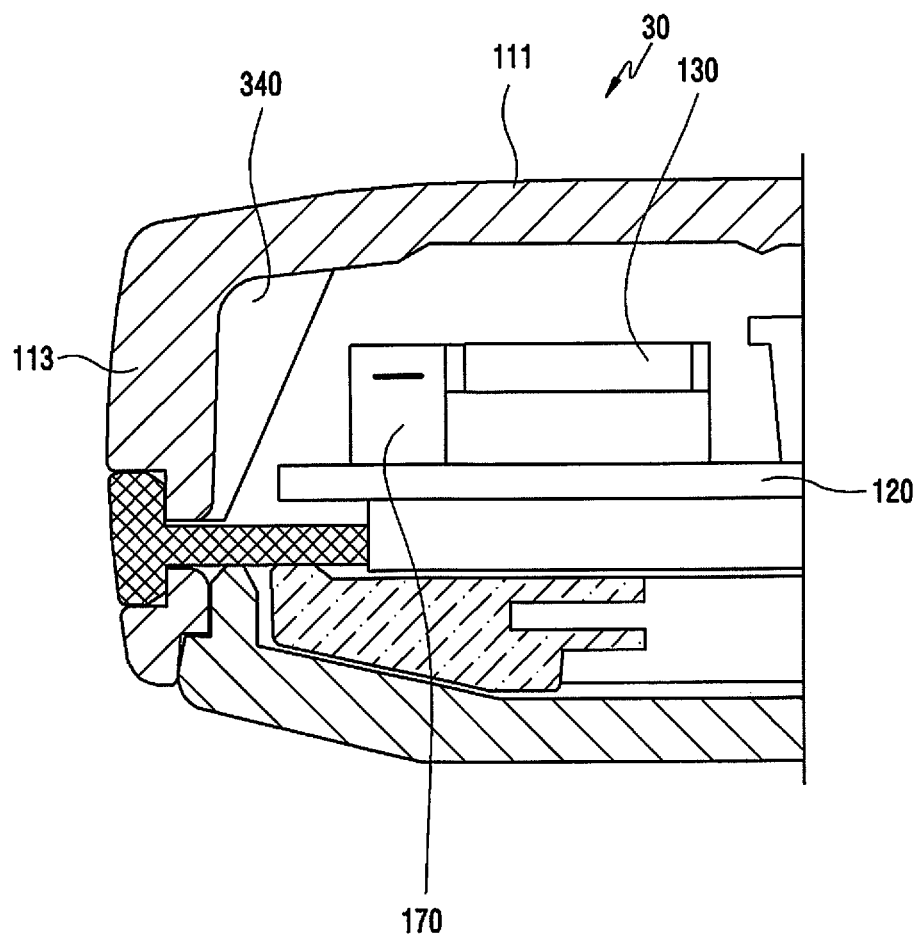
FIG. 7 is a cross-sectional view illustrating an antenna module mounting structure of an electronic device, according to an embodiment.

FIG. 7 is a cross-sectional view illustrating an antenna module mounting structure of an electronic device, according to an embodiment.

Referring to FIG. 7, regarding the electronic device 30, the same elements as in the electronic device 10 will not be described and only different elements will be described. The electronic device 30 may differ from the electronic device 10 in a dielectric structure 340.

The electronic device 30 includes an antenna module 130 disposed on the printed circuit board 120 and formed in front of the dielectric structure 340. The dielectric structure 340 may be formed on a portion facing the front portion of the antenna module 130 as an injection molding structure. The dielectric structure 340 may be extended between the first plate 111 and a lower end of the side surface member 113. The dielectric structure 340 may define a surface facing the antenna module 130 as an inclined surface. The nonmetallic structure P1 may be present, and to compensate for this, the dielectric structure 340 may have a larger volume than the dielectric structure 240.

Figure 8A:
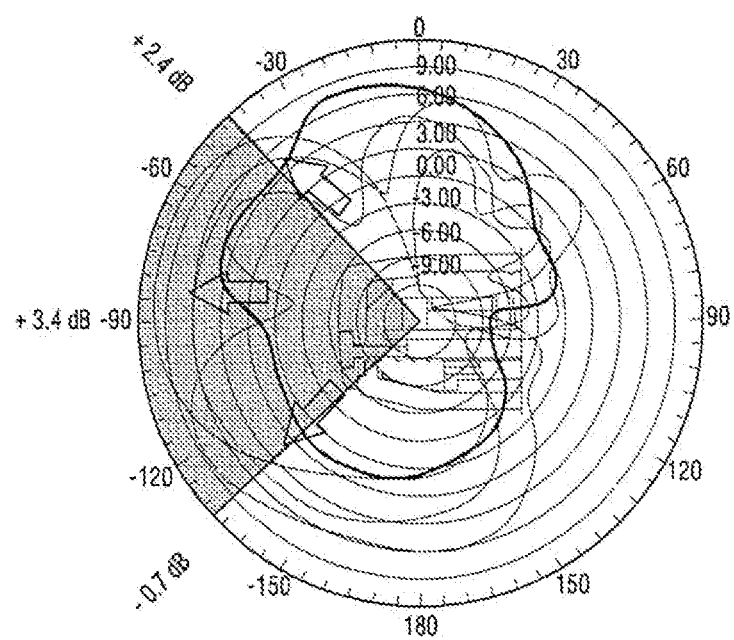
FIG. 8A is a view illustrating a graph indicating a radiation distribution of an antenna module according to a dielectric structure, according to an embodiment.
Figure 8B:
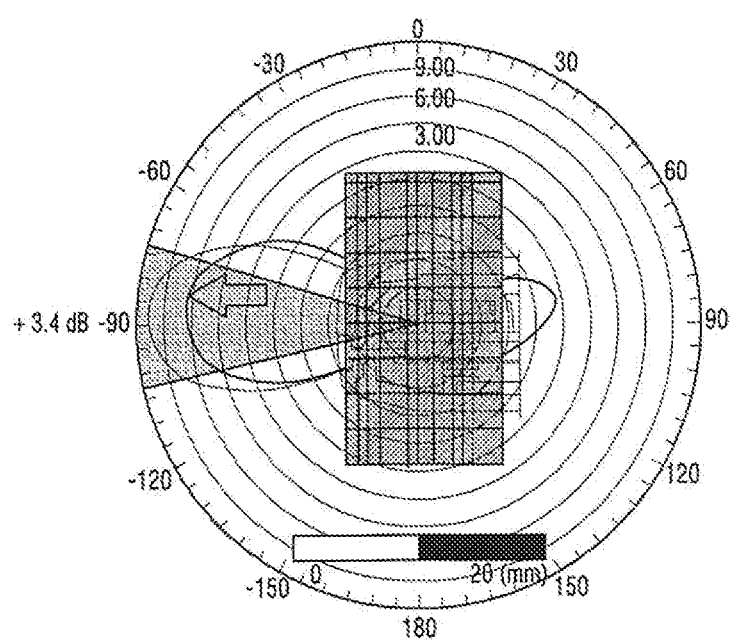
FIG. 8B is a view illustrating a graph indicating a radiation distribution after the antenna module shown in the graph of FIG. 8A is rotated by 90 degrees, according to an embodiment.

FIG. 8A is a view illustrating a graph indicating a radiation distribution of an antenna module according to a dielectric structure, according to an embodiment. FIG. 8B is a view illustrating a graph indicating a radiation distribution after the antenna module of FIG. 8A is rotated by 90 degrees, according to an embodiment. A pattern colored black is a radiation pattern before the dielectric structure 340 is added, and a pattern colored gray is a radiation pattern after the dielectric structure 340 is added.

Referring to FIGS. 8A and 8B, it can be seen that a coverage of an antenna radiation beam is maximized by adding the dielectric structure 340 to the antenna module 130. The antenna module can enhance a beam coverage sensitivity within +/−45 degrees on a side surface.

Figure 9:
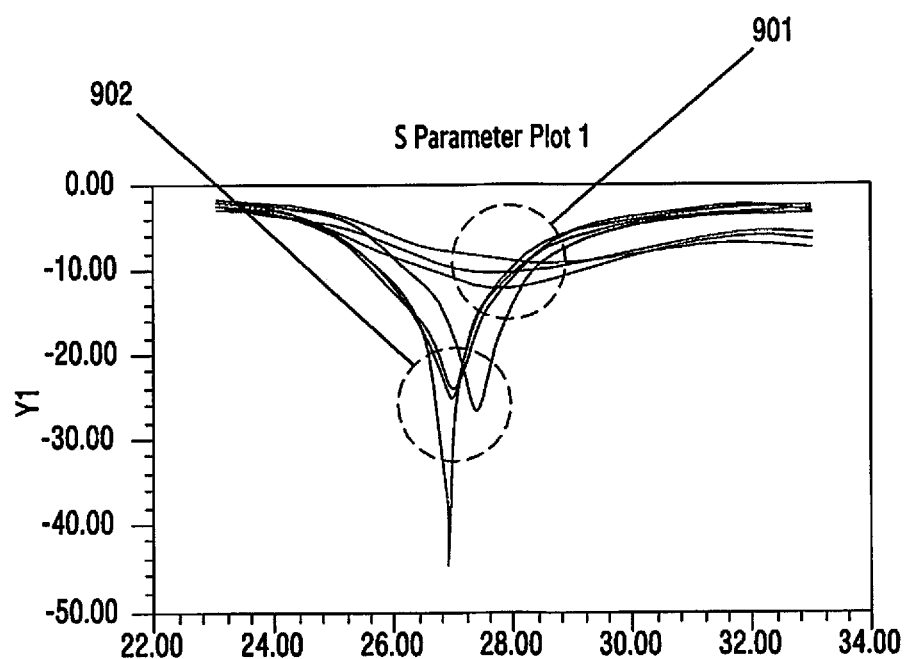
FIG. 9 is a view illustrating a graph indicating a resonant frequency of an antenna array, according to an embodiment.

FIG. 9 is a view illustrating a graph indicating a resonant frequency of an antenna array 170, according to an embodiment.

Referring to FIG. 9, the antenna array may communicate at the frequency of 27.5 GHz. A graph 901 indicates a resonant frequency before an antenna module 130 is mounted on a dielectric structure 140. A resonance is formed with reference to about 28 GHz band. A graph 902 indicates a resonant frequency after the antenna module 130 is mounted on the dielectric structure 140. A resonance is formed with reference to about 27.5 GHz band and thus is suitable for use in the frequency of 27.5 GHz for communication. The resonance of the antenna array 170 may be detuned before the antenna module 130 is mounted on the dielectric structure 140, and performance can be enhanced when the antenna module 130 is mounted on the dielectric structure 140.

Figure 10:
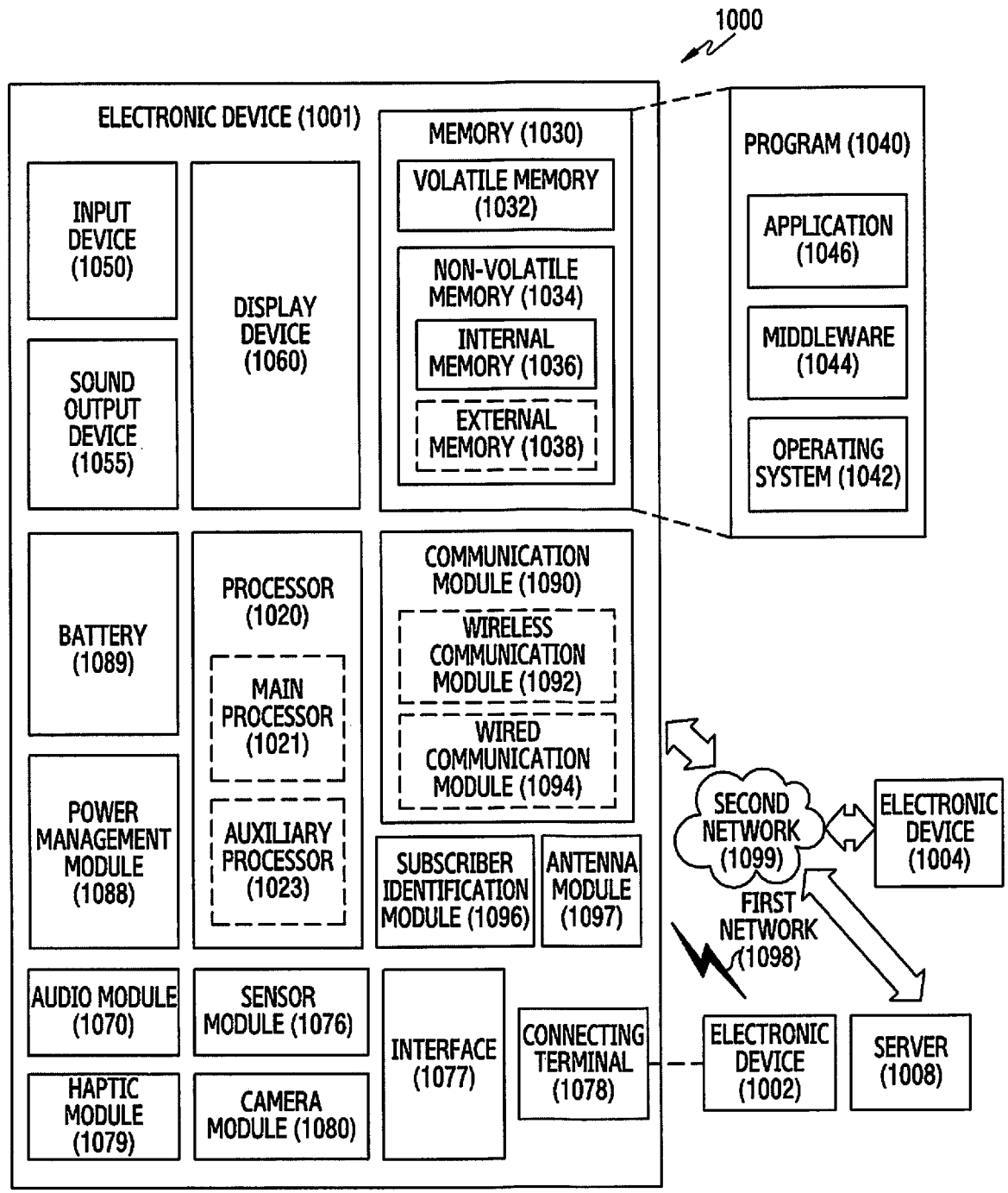
FIG. 10 is a block diagram of an electronic device within a network environment, according to an embodiment.

FIG. 10 is a block diagram illustrating an electronic device in a network environment, according to an embodiment.

Referring to FIG. 10, the electronic device 1001 in the network environment 1000 may communicate with an electronic device 1002 via a first network 1098 (e.g., a short-range wireless communication network), or an electronic device 1004 or a server 1008 via a second network 1099 (e.g., a long-range wireless communication network). According to an embodiment, the electronic device 1001 may communicate with the electronic device 1004 via the server 1008. According to an embodiment, the electronic device 1001 may include a processor 1020, memory 1030, an input device 1050, a sound output device 1055, a display device 1060, an audio module 1070, a sensor module 1076, an interface 1077, a haptic module 1079, a camera module 1080, a power management module 1088, a battery 1089, a communication module 1090, a SIM 1096, or an antenna module 1097. In some embodiments, at least one (e.g., the display device 1060 or the camera module 1080) of the components may be omitted from the electronic device 1001, or one or more other components may be added in the electronic device 1001. In some embodiments, some of the components may be implemented as single integrated circuitry. For example, the sensor module 1076 (e.g., a fingerprint sensor, an iris sensor, or an illuminance sensor) may be implemented as embedded in the display device 1060 (e.g., a display).

The processor 1020 may execute, for example, software (e.g., a program 1040) to control at least one other component (e.g., a hardware or software component) of the electronic device 1001 coupled with the processor 1020, and may perform various data processing or computation. According to one embodiment, as at least part of the data processing or computation, the processor 1020 may load a command or data received from another component (e.g., the sensor module 1076 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an application processor (AP)), and an auxiliary processor 1023 (e.g., a graphics processing unit (GPU), an image signal processor (ISP), a sensor hub processor, or a communication processor (CP)) that is operable independently from, or in conjunction with, the main processor 1021. Additionally or alternatively, the auxiliary processor 1023 may be adapted to consume less power than the main processor 1021, or to be specific to a specified function. The auxiliary processor 1023 may be implemented as separate from, or as part of the main processor 1021.

The auxiliary processor 1023 may control at least some of functions or states related to at least one component (e.g., the display device 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to an embodiment, the auxiliary processor 1023 (e.g., an image signal processor or a communication processor) may be implemented as part of another component (e.g., the camera module 1080 or the communication module 1090) functionally related to the auxiliary processor 1023.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input device 1050 may receive a command or data to be used by another component (e.g., the processor 1020) of the electronic device 1001, from the outside (e.g., a user) of the electronic device 1001. The input device 1050 may include, for example, a microphone, a mouse, a keyboard, or a digital pen (e.g., a stylus pen).

The sound output device 1055 may output sound signals to the outside of the electronic device 1001. The sound output device 1055 may include, for example, a speaker or a receiver. The speaker may be used for general purposes, such as playing multimedia or playing a record, and the receiver may be used for an incoming call. According to an embodiment, the receiver may be implemented as separate from, or as part of the speaker.

The display device 1060 may visually provide information to the outside (e.g., a user) of the electronic device 1001. The display device 1060 may include, for example, a display, a hologram device, or a projector and control circuitry to control a corresponding one of the display, hologram device, and projector. According to an embodiment, the display device 1060 may include touch circuitry adapted to detect a touch, or sensor circuitry (e.g., a pressure sensor) adapted to measure the intensity of force incurred by the touch.

The audio module 1070 may convert a sound into an electrical signal and vice versa. According to an embodiment, the audio module 1070 may obtain the sound via the input device 1050, or output the sound via the sound output device 1055 or a headphone of an external electronic device (e.g., an electronic device 1002) directly (e.g., wiredly) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. According to an embodiment, the sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device (e.g., the electronic device 1002) directly (e.g., wiredly) or wirelessly. According to an embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device (e.g., the electronic device 1002). According to an embodiment, the connecting terminal 1078 may include, for example, an HDMI connector, a USB connector, an SD card connector, or an audio connector (e.g., a headphone connector).

The haptic module 1079 may convert an electrical signal into a mechanical stimulus (e.g., a vibration or a movement) or electrical stimulus which may be recognized by a user via his tactile sensation or kinesthetic sensation. According to an embodiment, the haptic module 1079 may include, for example, a motor, a piezoelectric element, or an electric stimulator.

The camera module 1080 may capture a still image or moving images. According to an embodiment, the camera module 1080 may include one or more lenses, image sensors, image signal processors, or flashes.

The power management module 1088 may manage power supplied to the electronic device 1001. According to one embodiment, the power management module 1088 may be implemented as at least part of, for example, a power management integrated circuit (PMIC).

The battery 1089 may supply power to at least one component of the electronic device 1001. According to an embodiment, the battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more communication processors that are operable independently from the processor 1020 (e.g., the AP) and supports a direct (e.g., wired) communication or a wireless communication. According to an embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or Infrared Data Association (IrDA)) or the second network 1099 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The antenna module 1097 may transmit or receive a signal or power to or from the outside (e.g., the external electronic device) of the electronic device 1001. According to an embodiment, the antenna module 1097 may include an antenna including a radiating element composed of a conductive material or a conductive pattern formed in or on a substrate (e.g., PCB). According to an embodiment, the antenna module 1097 may include a plurality of antennas. In such a case, at least one antenna appropriate for a communication scheme used in the communication network, such as the first network 1098 or the second network 1099, may be selected, for example, by the communication module 1090 (e.g., the wireless communication module 1092) from the plurality of antennas. The signal or the power may then be transmitted or received between the communication module 1090 and the external electronic device via the selected at least one antenna. According to an embodiment, another component (e.g., a radio frequency integrated circuit (RFIC)) other than the radiating element may be additionally formed as part of the antenna module 1097.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1001 and the external electronic device 1004 via the server 1008 coupled with the second network 1099. Each of the electronic devices 1002 and 1004 may be a device of a same type as, or a different type, from the electronic device 1001. According to an embodiment, all or some of the operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1040) including one or more instructions that are stored in a storage medium (e.g., internal memory 1036 or external memory 1038) that is readable by a machine (e.g., the electronic device 1001). For example, a processor (e.g., the processor 1020) of the machine (e.g., the electronic device 1001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment, an electronic device includes a housing including a first plate facing in a first direction, a second plate facing in a second direction opposite to the first direction, and a side surface member surrounding at least part of a space between the first and second plates; a printed circuit board including a first surface facing in the first direction and a second surface facing in the second direction, the printed circuit board being disposed in the housing; an antenna module disposed on the first surface of the printed circuit board and adjacent to the side surface member, forming a first gap therewith, the antenna module being configured to radiate an antenna beam in a third direction which is perpendicular to the first and second directions; a wireless communication circuit electrically connected with the antenna module, and configured to transmit or receive a signal having a frequency between 3 GHz and 100 GHz; and a dielectric structure including a seating portion to have the antenna module mounted thereon, and configured to form the antenna beam to be radiated toward an outside of the housing in the third direction.

According to an embodiment, the antenna module includes at least one antenna array configured to support communication of a frequency band of 20 GHz or higher.

According to an embodiment, the third direction faces toward the outside of the housing from the antenna module.

According to an embodiment, the dielectric structure contacts the first surface of the printed circuit board, has a second gap formed with the side surface member, faces an inner surface of the side surface member, and has a third gap formed with the antenna module, and faces an antenna array of the antenna module.

According to an embodiment, the first gap is larger than the second gap.

According to an embodiment, the dielectric structure includes a support member of an injection molding material.

According to an embodiment, the support member is disposed on the first surface of the printed circuit board to have the antenna module seated thereon.

According to an embodiment, the support member includes a base; and at least one vertical sidewall extended along a circumference of the base to surround the circumference, and protruding from the circumference of the base in the first direction.

According to an embodiment, the base includes at least one first opening, and the vertical sidewall includes at least one second opening.

According to an embodiment, a soft circuit board is disposed in the second opening to electrically connect the antenna module to the printed circuit board.

According to an embodiment, the support member further includes a release prevention protrusion formed on the at least one vertical sidewall, and the release prevention protrusion protrudes in a fourth direction which is perpendicular to the first, second, and third directions.

According to an embodiment, the electronic device further includes at least one peripheral metal structure formed in the second direction of the printed circuit board.

According to an embodiment, the peripheral metal structure includes a SIM card socket device disposed on the second surface of the printed circuit board and having at least a portion formed with a metallic material; and an internal support structure having at least a portion formed with a metallic material and configured to support the printed circuit board.

According to an embodiment, the SIM card socket device includes a SIM card cover disposed to face in the third direction; a SIM card tray connected to the SIM card cover, having a SIM card seated therein, and inserted into or drawn out from the third direction; and a SIM card socket formed with a metallic material and configured to connect the seated SIM card to the printed circuit board.

According to an embodiment, an internal cover is further included between the second plate and the SIM card socket and the internal cover is connected with and disposed in parallel with the internal support structure.

According to an embodiment an electronic device includes a housing including a first plate facing in a first direction, a second plate facing in a second direction opposite to the first direction, and a side surface member surrounding at least part of a space between the first and second plates; a printed circuit board including a first surface facing in the first direction and a second surface facing in the second direction, the printed circuit board being disposed in the housing; an antenna module disposed on the first surface of the printed circuit board and adjacent to the side surface member, forming a first gap therewith, and the antenna module being configured to radiate an antenna beam in a third direction which is perpendicular to the first and second directions; a wireless communication circuit electrically connected with the antenna module, and configured to transmit or receive a signal having a frequency between 3 GHz and 100 GHz; an injection support member including a seating portion to have the antenna module mounted thereon, and configured to form an antenna beam to be radiated toward an outside of the housing in the third direction; a first peripheral metal structure configured to connect a seated SIM card to the printed circuit board; and a second peripheral metal structure disposed between the first peripheral metal structure and the second plate, the second peripheral metal structure being in parallel with the second plate.

According to an embodiment, the first peripheral metal structure includes a SIM card socket of a metallic material.

According to an embodiment, the second peripheral metal structure has at least a portion formed with a metallic material, and includes an internal support structure configured to support the printed circuit board.

According to an embodiment, the printed circuit board includes a third peripheral metal structure.

According to an embodiment, the injection support member is disposed to have a first gap with a front surface of the antenna module, and to have a second gap with an inner surface of the side surface member, wherein the second gap is smaller than the first gap.

The support member of the injection molding material for fixing the antenna module may be utilized as a component for forming an antenna beam radiated from the antenna module.

An antenna beam radiated from the antenna module may be detuned by changing the thickness and the shape of the support member of the injection molding material for fixing (i.e., positioning) the antenna module.

Beamforming may be performed for each antenna module by using supports members of an injection molding material for respectively fixing (i.e., positioning) a plurality of antenna modules.

Accordingly, interference of a radiation pattern may disappear by utilizing the support member of the injection molding material for fixing (i.e., positioning) the antenna module as a component for forming an antenna beam radiated from the antenna module, and directionality of a main beam can be adjusted.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:
1. An electronic device comprising:
 a housing comprising a first plate facing in a first direction, a second plate facing in a second direction opposite to the first direction, and a side surface member surrounding at least part of a space between the first and second plates;

a printed circuit board comprising a first surface facing in the first direction and a second surface facing in the second direction, the printed circuit board being disposed in the housing;

a dielectric structure disposed on the first surface of the printed circuit board, the dielectric structure having a base and a vertical sidewall that define an inner space of the dielectric structure;

an antenna module disposed adjacent to the side surface member, forming a first gap therewith, on a seating portion defined by the inner space of the dielectric structure, the antenna module being configured to radiate an antenna beam in a third direction which is perpendicular to the first and second directions;

a wireless communication circuit electrically connected with the antenna module, and configured to transmit or receive a signal having a frequency between 3 gigahertz (GHz) and 100 GHz; and the dielectric structure comprising the seating portion to have the antenna module mounted thereon, and configured to form the antenna beam to be radiated toward an outside of the housing in the third direction.

2. The electronic device of claim 1, wherein the antenna module comprises at least one antenna array configured to support communication of a frequency band of 20 GHz or higher.

3. The electronic device of claim 1, wherein the third direction faces toward the outside of the housing from the antenna module.

4. The electronic device of claim 1, wherein the dielectric structure contacts the first surface of the printed circuit board, has a second gap formed with the side surface member, faces an inner surface of the side surface member, has a third gap formed with the antenna module, and faces an antenna array of the antenna module.

5. The electronic device of claim 4, wherein the first gap is larger than the second gap.

6. The electronic device of claim 1, wherein the dielectric structure comprises a support member of an injection molding material.

7. The electronic device of claim 6, wherein the support member is disposed on the first surface of the printed circuit board to have the antenna module seated thereon.

8. The electronic device of claim 7, wherein the support member comprises:

a base; and at least one vertical sidewall extended along a circumference of the base to surround the circumference, and protruding from the circumference of the base in the first direction.

9. The electronic device of claim 8, wherein the base comprises at least one first opening, and wherein the vertical sidewall comprises at least one second opening.

10. The electronic device of claim 9, wherein a soft circuit board is disposed in the second opening to electrically connect the antenna module to the printed circuit board.

11. The electronic device of claim 8, wherein the support member further comprises a release prevention protrusion formed on the at least one vertical sidewall, and wherein the release prevention protrusion protrudes in a fourth direction which is perpendicular to the first, second, and third directions.

12. The electronic device of claim 1, further comprising at least one peripheral metal structure formed in the second direction of the printed circuit board.

13. The electronic device of claim 12, wherein the peripheral metal structure comprises:

a subscriber identity module (SIM) card socket device disposed on the second surface of the printed circuit board and having at least a portion formed with a metallic material; and an internal support structure having at least a portion formed with a metallic material and configured to support the printed circuit board.

14. The electronic device of claim 13, wherein the SIM card socket device comprises:

a SIM card cover disposed to face in the third direction;

a SIM card tray connected to the SIM card cover, having a SIM card seated therein, and inserted into or drawn out from the third direction; and a SIM card socket formed with a metallic material and configured to connect the seated SIM card to the printed circuit board.

15. The electronic device of claim 14, wherein an internal cover is further included between the second plate and the SIM card socket, and the internal cover is connected with and disposed in parallel with the internal support structure.

16. An electronic device comprising:

a housing comprising a first plate facing in a first direction, a second plate facing in a second direction opposite to the first direction, and a side surface member surrounding at least part of a space between the first and second plates;

a printed circuit board comprising a first surface facing in the first direction and a second surface facing in the second direction, the printed circuit board being disposed in the housing;

an antenna module disposed on the first surface of the printed circuit board and adjacent to the side surface member, forming a first gap therewith, and the antenna module being configured to radiate an antenna beam in a third direction which is perpendicular to the first and second directions;

a wireless communication circuit electrically connected with the antenna module, and configured to transmit or receive a signal having a frequency between 3 gigahertz (GHz) and 100 GHz;

an injection support member comprising a seating portion to have the antenna module mounted thereon, and configured to form an antenna beam to be radiated toward an outside of the housing in the third direction;

a first peripheral metal structure configured to connect a seated subscriber identity module (SIM) card to the printed circuit board; and a second peripheral metal structure disposed in parallel with and between the first peripheral metal structure and the second plate.

17. The electronic device of claim 16, wherein the first peripheral metal structure comprises a SIM card socket of a metallic material.

18. The electronic device of claim 16, wherein the second peripheral metal structure has at least a portion formed with a metallic material, and comprises an internal support structure configured to support the printed circuit board.

19. The electronic device of claim 16, wherein the printed circuit board comprises a third peripheral metal structure.

20. The electronic device of claim 16, wherein the injection support member is disposed to have a first gap with a front surface of the antenna module, and to have a second gap with an inner surface of the side surface member, wherein the second gap is smaller than the first gap.

* * * * *